United States Patent [19]
Leader, III et al.

[11] Patent Number: 5,917,236
[45] Date of Patent: Jun. 29, 1999

[54] PACKAGING SYSTEM FOR FIELD EFFECTS TRANSISTORS

[75] Inventors: Charles C. Leader, III; David D. Dearborn, both of San Jose; Shantanu Mitra, Redwood Shores, all of Calif.

[73] Assignee: Hewlett-Packard Company, Palo Alto, Calif.

[21] Appl. No.: 08/569,443

[22] Filed: Dec. 8, 1995

[51] Int. Cl.$^6$ .......................... H01L 23/495; H01L 23/52; H01L 23/34

[52] U.S. Cl. .......................... 257/670; 257/723; 257/685; 257/678

[58] Field of Search ...................................... 257/723, 783, 257/670, 676, 685, 686, 693, 678, 724, 704; 438/121, 110, 125

[56] References Cited

U.S. PATENT DOCUMENTS

| | | | |
|---|---|---|---|
| 5,243,218 | 9/1993 | Zenitani et al. | 257/712 |
| 5,470,787 | 11/1995 | Greer | 228/180.22 |
| 5,637,913 | 6/1997 | Kajihara et al. | 257/783 |

*Primary Examiner*—Mahshid Saadat
*Assistant Examiner*—Jhihan B. Clark
*Attorney, Agent, or Firm*—Jonathan B. Penn

[57] ABSTRACT

A packaging system for field effect transistor ("FET") dies is described. Individual FET dies are eutectically bonded to individual FET mounting bars. The mounting bar/FET die combination is then eutectically bonded, along with the other components comprising the package, to a package base. After a wiring operation, the package is completed by sealing it with a cover. This packaging system has many fewer parts than known FET packages, permits the economical correction of micro-voids between the FET dies and the mounting bars, and is significantly less expensive than known FET packages.

9 Claims, 9 Drawing Sheets

FIG.12

PACKAGING SYSTEM FOR FIELD EFFECTS TRANSISTORS

FIELD OF THE INVENTION

This invention relates generally to the packaging of semiconductor components. More particularly it relates to the packaging of power field effect transistors ("FET"s) for microwave applications.

BACKGROUND OF THE INVENTION

FIGS. 1 through 5 illustrate various aspects of a known FET package, wherein the power FETs are eutectically attached directly to the base of the package. In high power microwave applications, direct attachment of the power FETs to the package base is favored so that the greatest possible heat sinking can be achieved.

Figure 1:
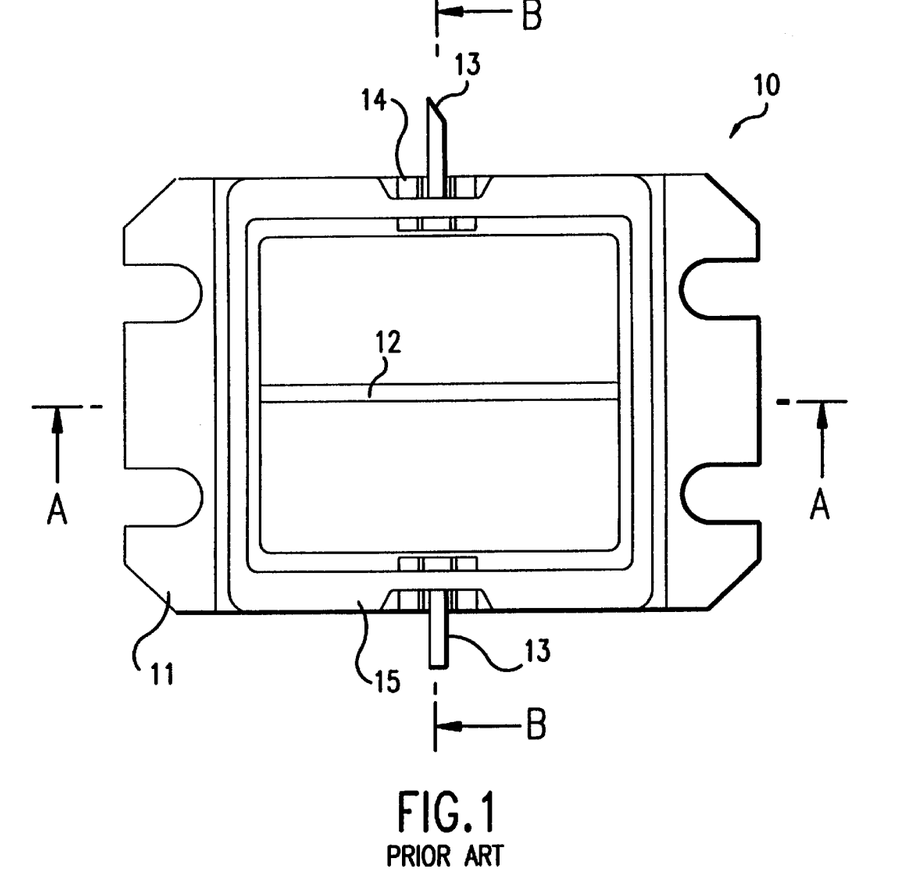
FIG. 1 is a top plan view of a known FET package.
Figure 2:
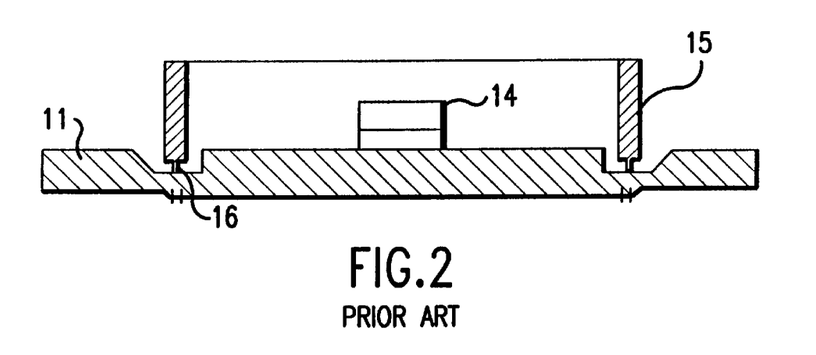
FIG. 2 is a cross-section of the package shown in FIG. 1, taken along the line A—A.
Figure 3:
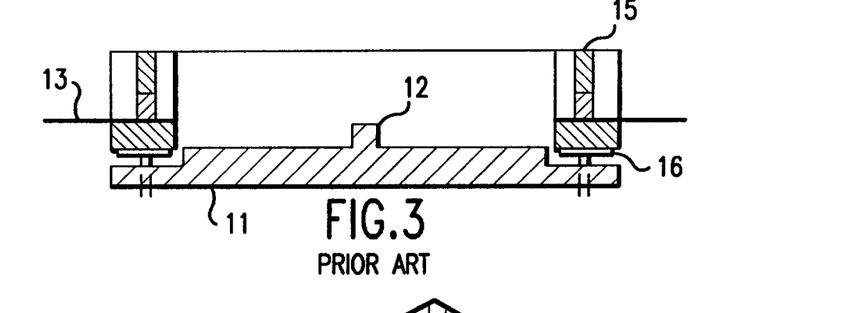
FIG. 3 is another cross-section of the package shown in FIG. 1, taken along the line B—B.

As shown in FIGS. 1 through 3, package 10 is fabricated from many separate parts, including package base 11 with raised FET mounting pedestal 12, package side walls 15 with lead out assembly 14 and leads 13.

Figure 4:
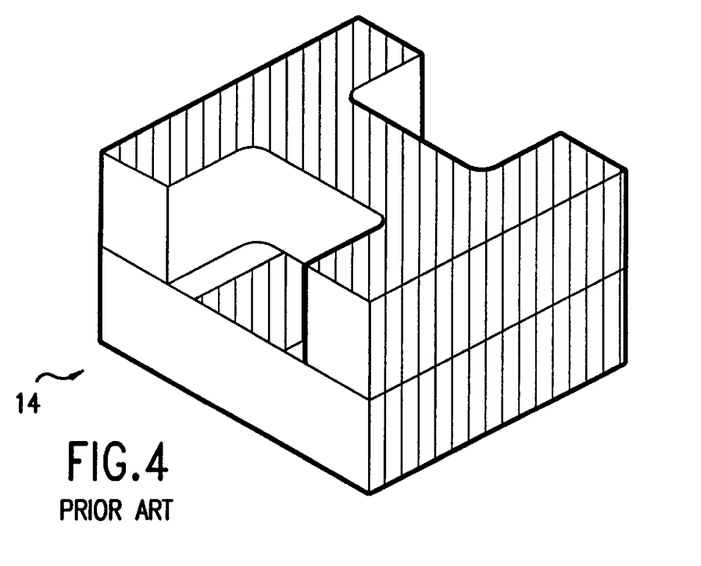

As shown particularly in FIGS. 2 and 3, package side walls 15 are supported by rectangular shim 16. Lead out assembly 14, as shown in FIG. 4, has an upper component, a lower component, both formed from an alumina ceramic, and a conductive trace. The printed metallization conductive trace couples circuitry within the package to external circuitry.

Figure 5:
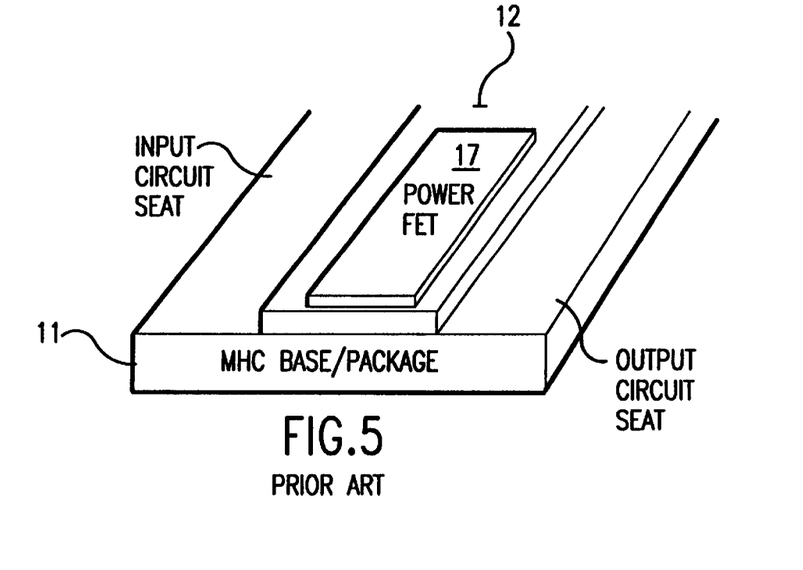
FIG. 5 is a detail of the FET mounting section of the package shown in FIG. 1.

As shown in FIG. 5, FET dies 17 are eutectically attached to the top surface of mounting pedestal 12. Each FET die contains a plurality of individual FETs, which are coupled together. Eutectic attachment defines a process wherein an alloy with a low melting temperature, typically gold based, is used to form a thermally and electrically conductive bond between a metallized back surface of the FET dies and a mounting surface. The liquidus temperature of the alloy increases each time it is remelted, as its chemical composition changes.

Not illustrated in FIGS. 1 through 5 are the many individual shims and spacers needed to bring the electrical circuits and components into proper alignment with one another. In most known FET packages, the top surfaces of all the individual components are roughly coplanar.

This type of known package has many shortcomings. Most obviously it is fabricated from many small, discrete components, each of which must be separately manufactured, placed, and secured to complete the package. This increases the cost of the finished package.

Lead out assembly 14's conductive trace is only a very thin metal film. As such, the amount of current it can carry is limited.

The mounting of FET dies 17 on mounting pedestal 12 is a source of several problems. As the FET dies are mounted on pedestal 12 after side walls 15 are already in place, the assembler placing the FET dies on the pedestal has only restricted access to the work area. The FET die is placed on the pedestal and sufficient heat is applied to the pedestal to eutectically bond the die to the pedestal using a eutectic preform. Typically this requires that the assembler move the die back and forth on the pedestal as the gold alloy used to form the eutectic bond becomes molten. This action is known as "scrubbing". As additional dies are placed on the pedestal, the pedestal must remain heated as the new die are scrubbed across the pedestal. As more dies are placed on the pedestal, less and less space remains for scrubbing.

Given that typical high power FET packages contain from 2 to 4 FET dies, those dies that are placed first on the pedestal experience repeated or extended high temperature as each additional die is placed on the pedestal. This repeated or extended thermal stress can by itself lead to the degradation or failure of FET dies.

If the scrubbing process is not done properly, micro-voids form between the FET die and the pedestal. Unless these are detected using X-ray radiographic examination and eliminated during rework, the long term reliability of the FET die may be sacrificed. The bond to the pedestal provides a critical heat sink path for the FET die. The presence of a microvoid results in uneven thermal conductivity across the die/pedestal interface and gives rise to hot spots on the FET die surface. These hot spots can lead to early failure. Unfortunately, if there is insufficient room on the pedestal to permit adequate scrubbing, the chance of these micro-voids occurring is increased.

Even if the micro-voids are detected before power is applied to the device, attempts to rework the die/pedestal connection apply even more thermal stress to the other FET dies on the pedestal, as the rework temperature is higher than the original eutectic temperature, without any guarantee that the connection can be successfully reworked. The percentage of successfully reworked packages is typically between 20–50%. All FET dies and often the package from an unsuccessfully reworked assembly must be scrapped.

The numerous parts required to form a completed FET package, the high thermal stress placed on the components during assembly, and the large amount of assembly time and effort needed to assemble the FET package all result in a very low yield product having a high manufacturing cost.

SUMMARY OF THE INVENTION

A first preferred embodiment of the present invention comprises a simplified packaging system for internally matched ("IM") FET dies. Individual FET dies are placed on separate small thermally conductive mounting bars. As there is only one die on each mounting bar, there is always adequate room for proper scrubbing. Even if micro-voids occur, the individual die can be reworked and tested again before placement in the packaging system. All components of the system can be placed on the package's base and eutectically bonded simultaneously. If micro-voids form between the mounting bars and the package base, this is of diminished importance, as the mounting bars' act as heat spreaders to prevent hot spots on the die despite the micro-voids between the mounting bar and the package base. The finished package has many fewer parts than those currently in use and its method of fabrication permits reworking the FET/mounting bar connection on an individual basis, allowing for a much higher process yield. The finished IMFET package is less expensive than those currently known and potentially more reliable as a result of less thermal stress being applied to the FET die.

The details of the preferred embodiment's construction and fabrication will be discussed in detail with reference to the figures listed and briefly described below.

BRIEF DESCRIPTION OF THE ILLUSTRATION

FIG. 4 is a detail of the lead out portion of the

DETAILED DESCRIPTION OF THE PREFERRED EMBODIMENT

Figure 6:
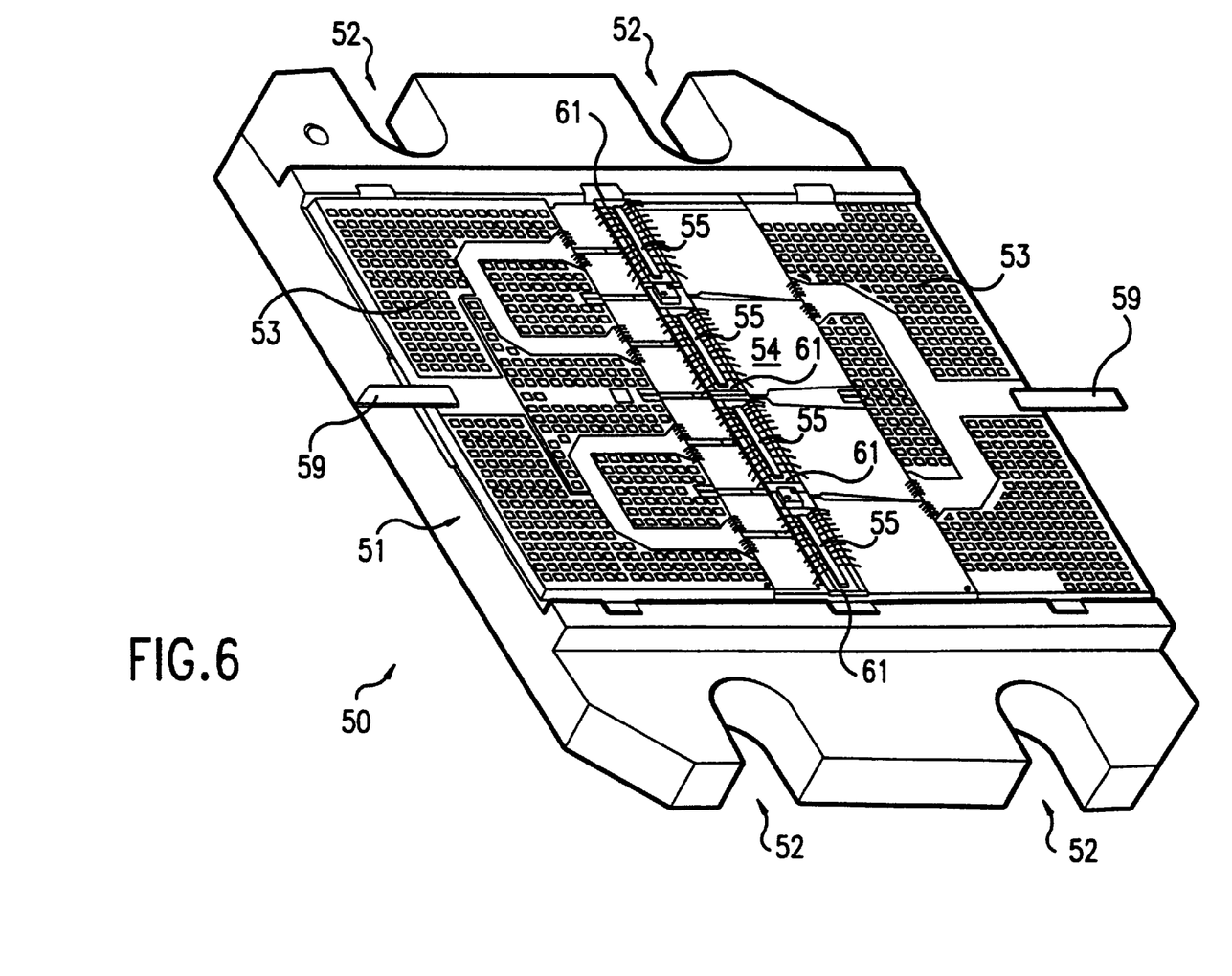
FIG. 6 is a perspective drawing of the first embodiment of the present invention, shown without its top cover.
Figure 8:
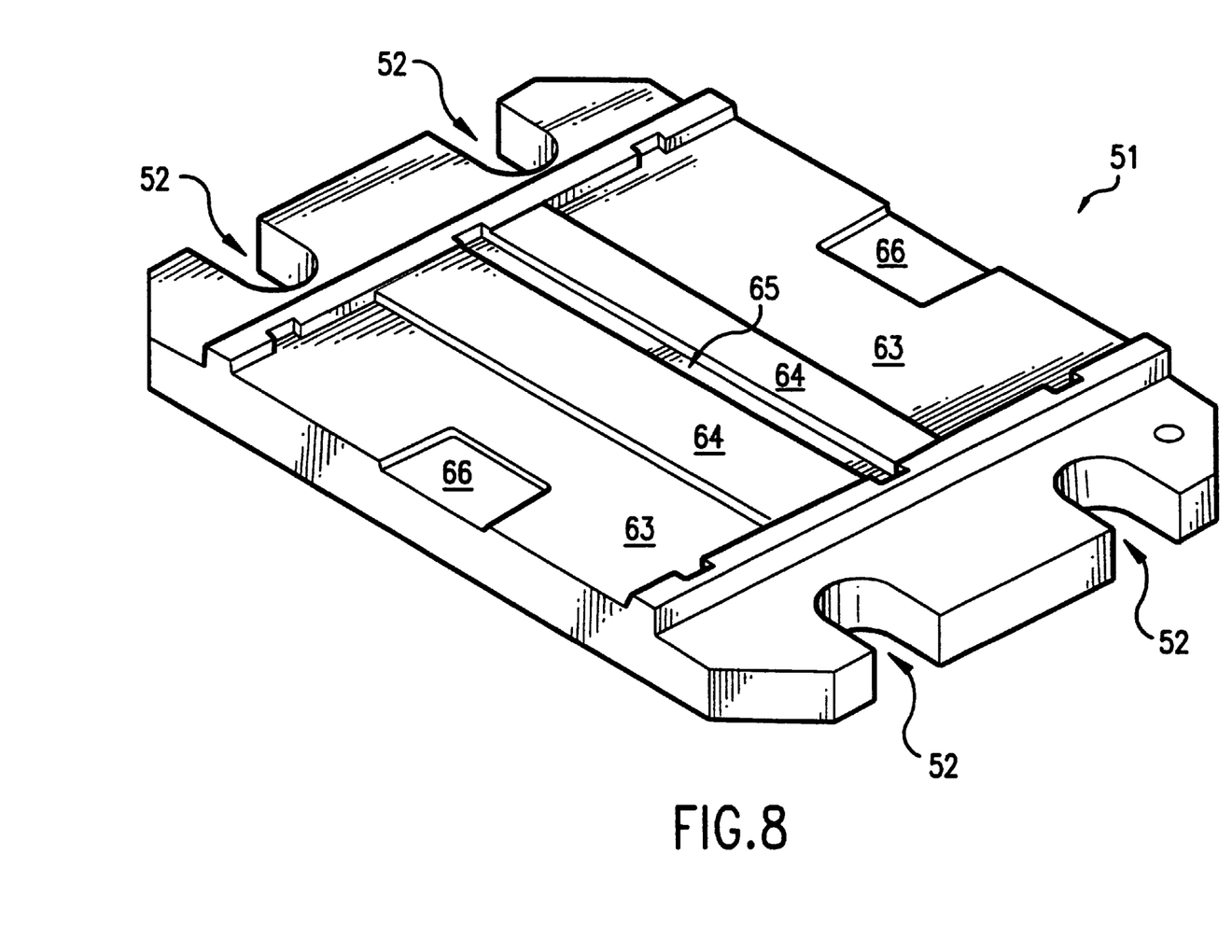
FIG. 8 is a perspective drawing of the package base used in the first embodiment of the present invention.

A completed package 50, embodying the present invention, is shown in FIG. 6. Package 50's cover is not shown in this illustration. All components are mounted on package base 51, which is shown in greater detail in FIG. 8. Referring to FIG. 8, base 51 is formed in a single stamping operation from a copper blank and can be plated with gold or a similar metal. The stamping operation forms several depressed areas used for mounting the electrically active and passive components of the present invention. These depressions include air gap depression 66, first substrate depressions 63, second substrate depressions 64, and mounting bar depression 65. Castellations 52 for mounting lugs are also formed as part of the stamping operation.

Referring back to FIG. 6, first and second substrates 53 and 54 are attached directly to package base 51, without the use of a molybdenum or alumina shim, using a gold based eutectic preform, and are electrically coupled together in a separate wiring operation. Mounting bars 61 with FET dies 55 mounted thereon are eutectically attached to mounting bar depression 65 and electrically coupled to the second substrates 54 and to one another. Input/output lead frame 59 is also attached to the first substrates 53.

Figure 9A:
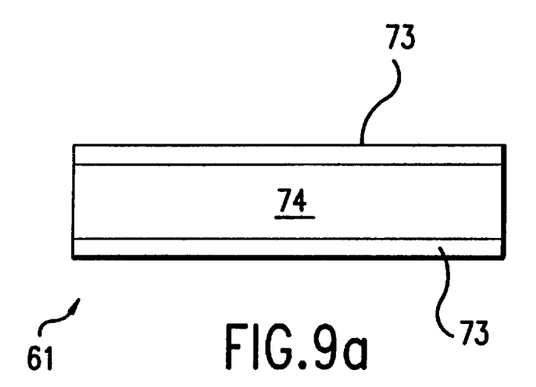
FIGS. 9a, 9b, and 9c are respectively a top, side, and cross section of the FET die mounting bar used in the first embodiment of the present invention.
Figure 9B:
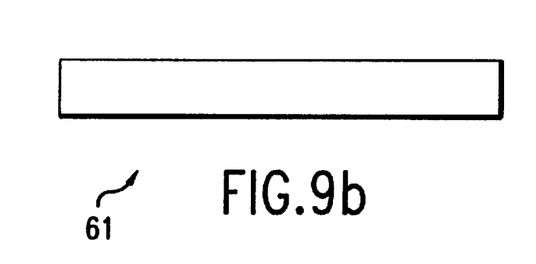
Figure 9C:
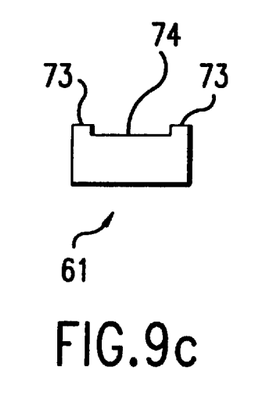

FIGS. 9a, 9b, and 9c show details of mounting bar 61's construction. FET die mounting area 74 receives FET die 55. Guard rails 73 help locate the die on the top of mounting bar 61. The thickness of mounting bar 61 is 20 mils. Mounting bars thicker than this have only marginally improved heat spreading qualities.

Figure 7:
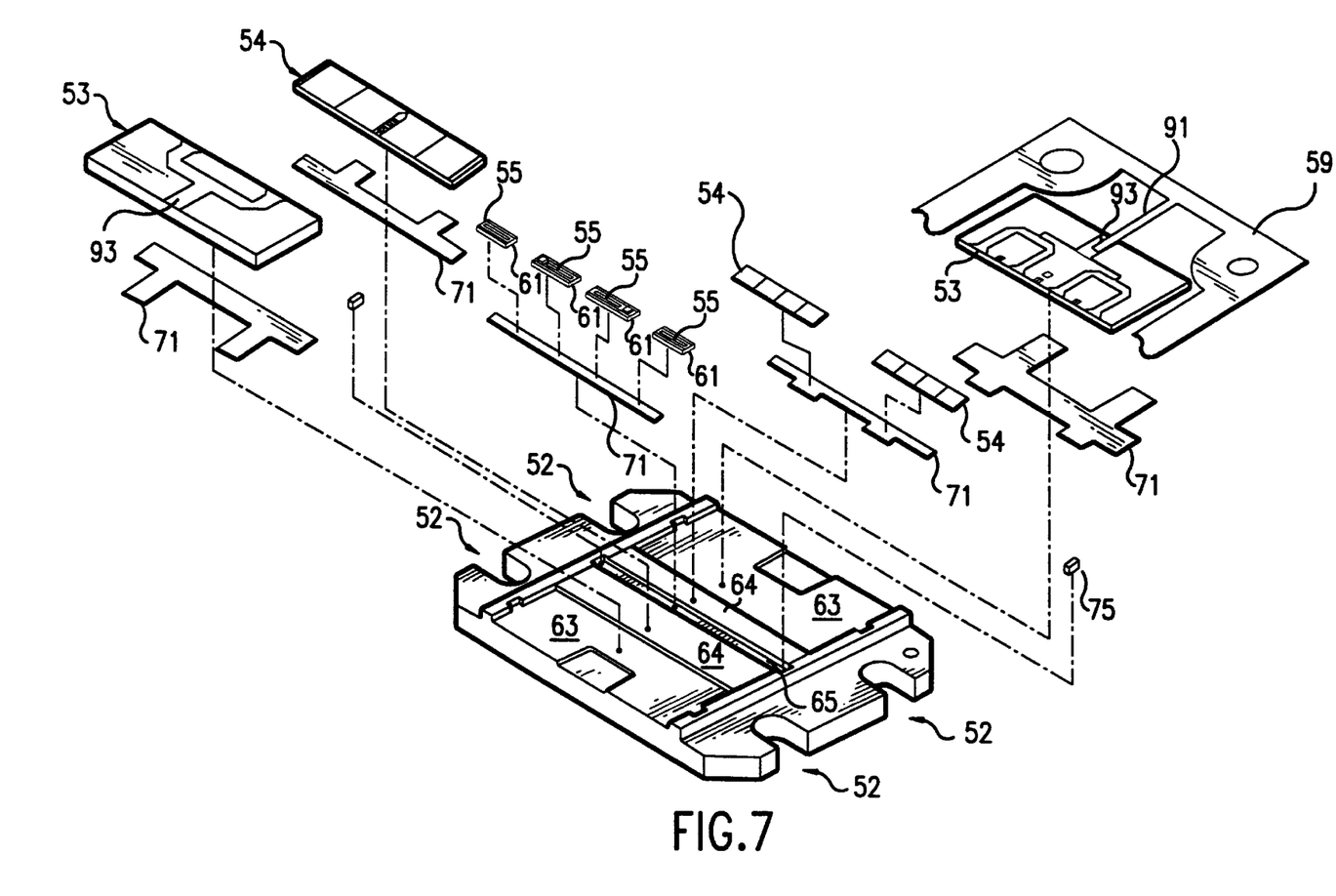
FIG. 7 is an exploded isometric drawing of the first embodiment of the present invention, not including its top cover.

FIG. 7, the exploded isometric drawing of the present invention, illustrates how package 50 is assembled. Eutectic alloy preforms 71, which in this embodiment comprise a gold based alloy, are placed in depressions 63, 64, and 65. First substrates 53 are placed over preforms 71 covering depression 63, second substrates 54 are placed over preforms 71 covering depressions 64, and mounting bars 61 with FET dies 55 mounted thereon are placed over preforms 71 covering depression 65. Channel blocks 75 are placed at the end of depression 65 and on preform 71 covering that depression. Finally, lead frame 59 is placed on top of substrates 53 so that the ends of input/output lead 91 rest on mounting pad 93. A preform (not shown) is placed between the end of input/output lead 91 and pad 93.

Figure 10:
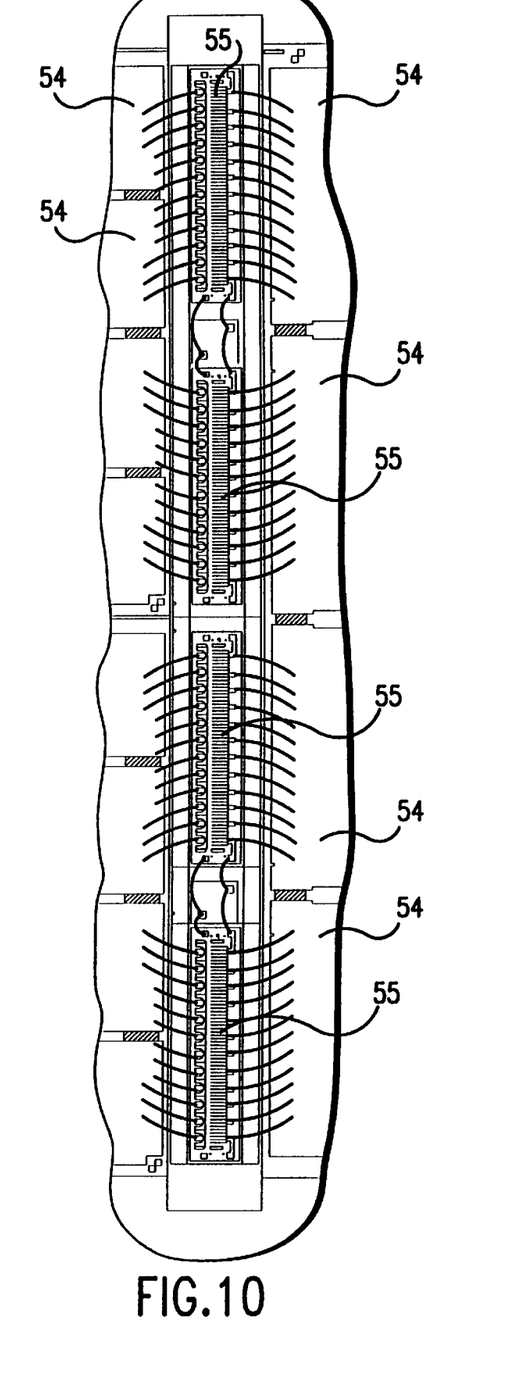
FIG. 10 is a detail drawing showing the electrical connections between the FETs and the substrates used in the first embodiment of the present invention.

The loosely assembled package can then be placed in a furnace. If the atmosphere and temperature of the furnace are controlled, the components can be eutectically bonded to base 51 simultaneously. After this eutectic bonding operation, the substrates 53 and 54 and the FET dies 55 dies must be electrically coupled together. Methods to create these electrical couplings are known and these known methods can be used herein. FIG. 10 illustrates the electrical connections between the second substrates 54 and the FET dies 55, as well as the connections between the FET dies themselves. After the electrical connections have been made, lead frame 59 with input/output leads 91 can be trimmed and a cover 80 placed over the package.

Figure 11A:
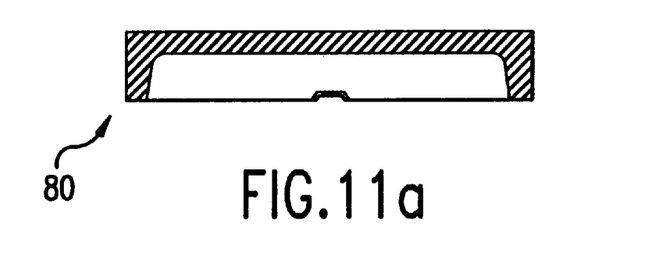
FIGS. 11a, 11b, and 11c are respectively a first cross-section, a second cross section, and a bottom plan view of the cover used in the first embodiment of the present invention.
Figure 11B:
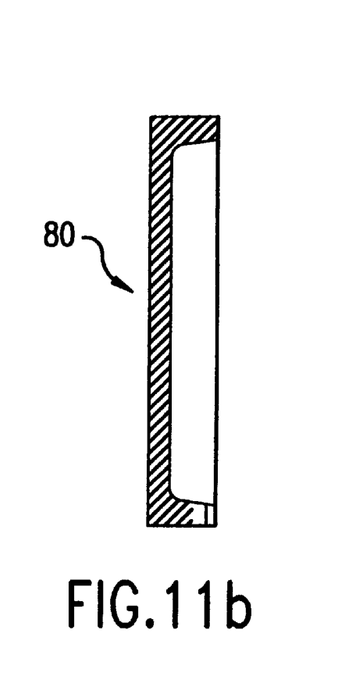
Figure 11C:
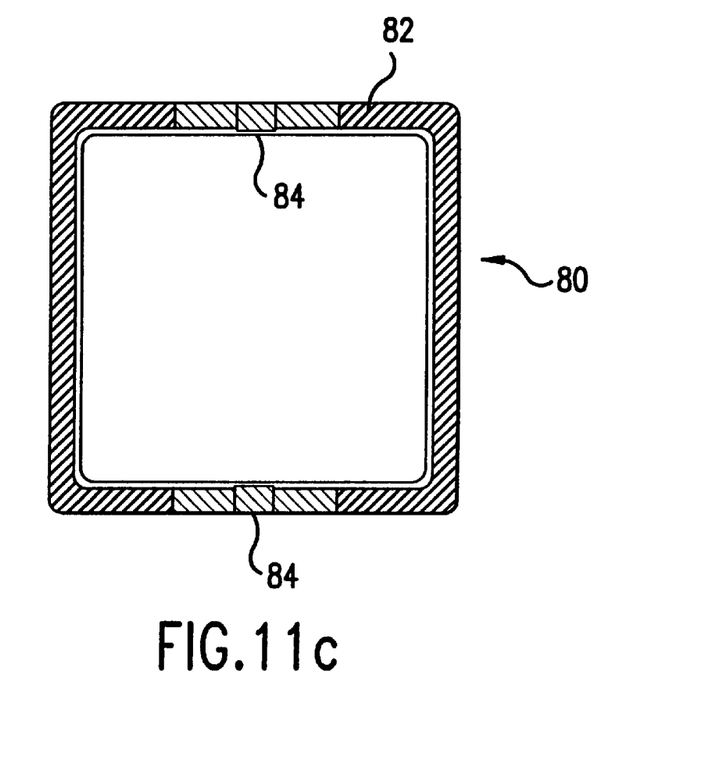
Figure 12:
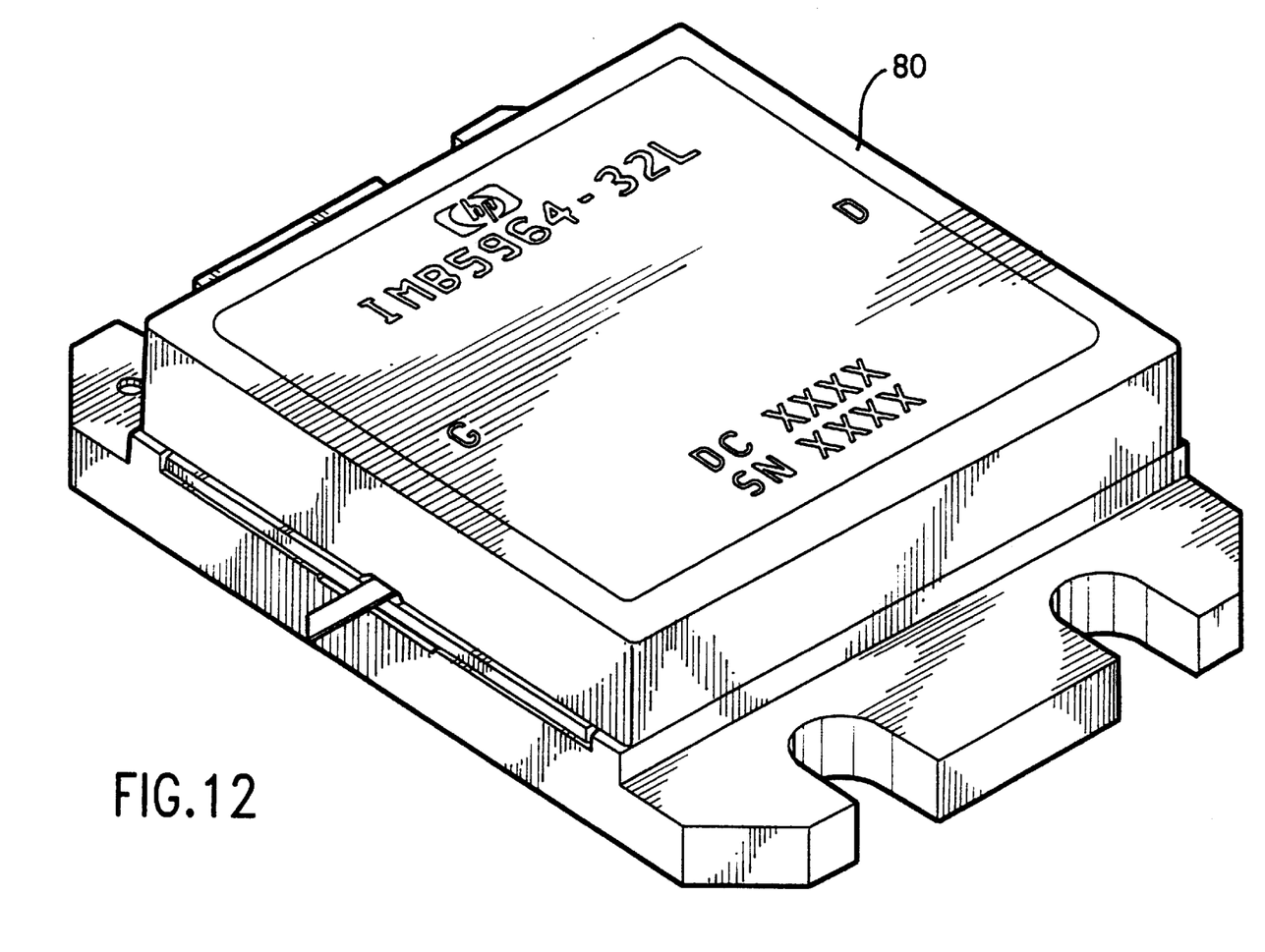
FIG. 12 is a perspective drawing of the completed first embodiment of the present invention.

FIGS. 11a, 11b, and 11c are respectively a first cross-section, a second cross-section, and a bottom plan view of cover 80. Cover 80 is made from a ceramic or plastic. Sections 84, overlying input/output leads 59, are coated with an electrically non-conductive epoxy adhesive, the remaining portions of edge 82 being coated with a conductive adhesive. When placed over base 51 and heated, the combination forms finished package 50. The finished package is illustrated in FIG. 12.

During assembly, no shims or spacers are needed in the present invention to insure proper alignment of the internal electrically active and passive components, circuits, and substrates. The proper stamping or coining of base 51 insures that the components can be mounted in the relevant depressions without need of additional spacers or shims.

The use of the individual small mounting bars 61 for mounting FET dies 55 has numerous advantages. Once the FET die is attached to mounting bar 61, it can be X-rayed either individually or in an array to detect micro-voids. Poorly attached FET dies can then be reworked easily by reheating only the defective FET die/mounting bar combination, which avoids subjecting other components in the package to thermal stress. If the mounting bar/FET die combination cannot be reworked, it can be discarded without the loss of the other components that comprise the finished package. Even if micro-voids exist between the mounting bar and the package base, these will have a small impact on the FET die, as the mounting bar's contact area with the package base and its heat spreading capacity still permit sufficient thermal conduction to avoid damage to the FET die. The incorporation of an individual removable FET die/mounting bar combination also simplifies automating the attachment of the FET dies to the mounting bars and to the package base. Once the FET dies have been attached to the mounting bars and inspected, the performance characteristics of the FET dies can be determined and FET die/mounting bar combinations with matched performance characteristics can be selected with more certainty than is currently obtained in known package manufacturing methods. The present invention's method of assembling a high power IMFET has a manufacturing cost advantage, estimated as at least 50% less than known methods for assembling IMFET systems.

Although this specification refers only to FET dies, nothing herein should be taken to limit the present invention to using only such dies. Other high power components using different materials other than the GaAs typically used in FET dies could be substituted for the FET dies without any significant modification of the present invention.

What is claimed is:

1. A packaging system for semiconductor components, the system comprising:

a plurality of semiconductor components;

a plurality of mounting bars, each semiconductor component being mounted on, and eutectically attached to, an individual one of the mounting bars; and a base, the mounting bars being eutectically attached to the base;

wherein the mounting bars are attached to input/output circuitry, and the input/output circuitry is eutectically attached to the base.

2. The packaging system of claim 1 wherein a cover is placed over the base after the mounting bars and input/output circuitry is attached thereto.

3. The packaging system of claim 1 wherein the base is made of a conductive material and has respective depressions for receiving the mounting bars and the input/output circuitry.

4. The packaging system of claim 3 wherein a lead frame is attached to the input/output circuitry to provide input/output leads for the package.

5. The packaging system of claim 4 wherein a cover is sealed over the base after the input/output circuitry and the components have been coupled together.

6. A field effect transistor package comprising:

a plurality of field effect transistor carriers, each carrier having a field effect transistor electrically and mechanically bonded thereto;

a lower package component, the lower package component having a plurality of depressions therein, at least one of the depressions receiving the plurality of carriers and the carriers being electrically and mechanically bonded to the depression;

input/output circuitry eutectically bonded to the remaining depressions in the lower package component, the input/output circuitry being coupled to the field effect transistors and the field effect transistors being coupled to one another; and a package cover, sealed over the lower package component.

7. The package of claim 6 wherein the transistors are eutectically bonded to the carriers and the carriers are eutectically bonded to the lower package component.

8. The package of claim 6 wherein the lower package component in coined from a metallic blank.

9. The package of claim 6 wherein all electrically active components are eutectically bonded simultaneously to the lower package component.

* * * * *